United States Patent
Kwon et al.

(10) Patent No.: US 9,711,554 B2
(45) Date of Patent: Jul. 18, 2017

(54) IMAGE SENSOR

(71) Applicant: SAMSUNG ELECTRONICS CO., LTD., Suwon-Si, Gyeonggi-Do (KR)

(72) Inventors: DooWon Kwon, Seongnam-Si (KR); Taeseok Oh, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/958,987

(22) Filed: Dec. 4, 2015

(65) Prior Publication Data

US 2016/0190198 A1 Jun. 30, 2016

(30) Foreign Application Priority Data

Dec. 29, 2014 (KR) ........................ 10-2014-0192107

(51) Int. Cl.
*H01L 27/146* (2006.01)

(52) U.S. Cl.
CPC .... *H01L 27/14636* (2013.01); *H01L 27/1464* (2013.01); *H01L 27/1469* (2013.01); *H01L 27/14612* (2013.01); *H01L 27/14623* (2013.01); *H01L 27/14634* (2013.01); *H01L 27/14621* (2013.01); *H01L 27/14627* (2013.01); *H01L 2924/0002* (2013.01)

(58) Field of Classification Search
CPC ........... H01L 27/1464; H01L 27/14638; H01L 27/14634; H01L 27/14636; H01L 27/14643; H01L 25/043
See application file for complete search history.

(56) References Cited

U.S. PATENT DOCUMENTS

| | | | |
|---|---|---|---|
| 6,861,376 B1 * | 3/2005 | Chen | ................. H01L 21/76808 257/E21.027 |
| 7,495,206 B2 * | 2/2009 | Park | ................. H01L 27/14634 250/214.1 |
| 7,965,329 B2 | 6/2011 | McCarten et al. | |
| 8,792,034 B2 | 7/2014 | Takahashi | |
| 2004/0152333 A1 * | 8/2004 | Zhao | ................. H01L 21/3185 438/754 |

(Continued)

FOREIGN PATENT DOCUMENTS

| | | |
|---|---|---|
| JP | 2014-022561 | 2/2014 |
| KR | 1020110078558 | 7/2011 |

*Primary Examiner* — Tucker J Wright
(74) *Attorney, Agent, or Firm* — F.Chau & Associates, LLC

(57) ABSTRACT

An image sensor includes a pixel array chip, a logic chip, and an interposed layer. The interposed layer is disposed on the pixel array chip. The logic chip is disposed on the interposed layer. The interposed layer includes a connecting part, a shielding part, and a metal-diffusion barrier layer. The connecting part electrically connects a first interconnection wire of the pixel array chip and a second interconnection wire of the logic chip. The connecting part includes a first metallic element. The shielding part is disposed spatially apart from the connecting part and electrically grounded to suppress an electrical coupling between the pixel array chip and the logic chip. The shielding part includes a second metallic element. The metal-diffusion barrier layer is disposed on top and bottom surfaces of the interposed layer to limit diffusion of electrical charges to the pixel array chip and the logic chip.

10 Claims, 8 Drawing Sheets

(56) References Cited

U.S. PATENT DOCUMENTS

| | | | |
|---|---|---|---|
| 2005/0248002 A1* | 11/2005 | Newman | H01L 21/76898 257/621 |
| 2006/0146233 A1* | 7/2006 | Park | H01L 27/14634 349/95 |
| 2013/0284885 A1 | 10/2013 | Chen et al. | |
| 2014/0145288 A1* | 5/2014 | Hayashi | H01L 27/1461 257/435 |
| 2014/0264508 A1 | 9/2014 | Kao et al. | |
| 2014/0284745 A1 | 9/2014 | Seta | |
| 2015/0084194 A1* | 3/2015 | Molzer | H01L 23/481 257/741 |

\* cited by examiner

IMAGE SENSOR

CROSS-REFERENCE TO RELATED APPLICATIONS

This U.S. non-provisional patent application claims priority under 35 U.S.C. §119 to Korean Patent Application No. 10-2014-0192107, filed on Dec. 29, 2014, in the Korean Intellectual Property Office, the disclosure of which is incorporated by reference herein in its entirety.

TECHNICAL FIELD

Exemplary embodiments of the present inventive concept relate to an image sensor, and more particularly, to a complementary metal-oxide semiconductor (CMOS) image sensor.

DISCUSSION OF THE RELATED ART

An image sensor converts optical images into electrical signals. The image sensor may be used in a variety of applications such as digital cameras, camcorders, personal communication systems, gaming machines, security cameras, micro-cameras for medical applications, robots, or the like.

The image sensor may be integrated as a single chip. As the electronic industry advances, demand for the image sensor with a high density and a reduced pixel size is increased.

SUMMARY

According to an exemplary embodiment of the present inventive concept, an image sensor is provided. The image sensor includes a pixel array chip, a logic chip, and an interposed layer. The interposed layer is disposed on the pixel array chip. The logic chip is disposed on the interposed layer. The interposed layer includes a connecting part, a shielding part, and a metal-diffusion barrier layer. The connecting part electrically connects a first interconnection wire of the pixel array chip and a second interconnection wire of the logic chip. The connecting part includes a first metallic element. The shielding part is disposed spatially apart from the connecting part and electrically grounded to suppress an electrical coupling between the pixel array chip and the logic chip. The shielding part includes a second metallic element. The metal-diffusion barrier layer is disposed on top and bottom surfaces of the interposed layer to limit diffusion of electrical charges to the pixel array chip and the logic chip.

The pixel array chip may include at least one photoelectric conversion device.

Each of the connecting part and the shielding part may be formed of copper (Cu) or tungsten (W).

The interposed layer may further include an insulating layer, and each of the connecting part and the shielding part may be provided to penetrate the insulating layer.

The metal-diffusion barrier layer may be provided on or below the insulating layer.

The metal-diffusion barrier layer may be provided in the insulating layer.

The insulating layer may include a first insulating layer and a second insulating layer disposed on the first insulating layer. The connecting part may include a first connection pattern in the first insulating layer and a second connection pattern in the second insulating layer. The shielding part may include a first shielding pattern and a second shielding pattern. The first shielding pattern may be provided in the first insulating layer and spaced apart from the first connection pattern. The second shielding pattern may be provided in the second insulating layer and spaced apart from the second connection pattern.

The first connection pattern and the second connection pattern may be in contact with each other.

The connecting part may further include an interlayered connection pattern provided between the first and second connection patterns to electrically connect the first and second connection patterns to each other.

A size of the interlayered connection pattern may be smaller than a size of each of the first and second connection patterns.

The second connection pattern may be disposed on a first surface of the first connection pattern. The first connection pattern may be formed of a conductive material except a first portion. The first portion may be formed from a portion of the first surface toward the inside of the first connection pattern.

The second connection pattern may be disposed on the first connection pattern in a first direction. A bottom surface of the first connection pattern may face a top surface of the second connection pattern with respect to a plane substantially perpendicular to the first direction. The first connection pattern may be formed of a conductive material, except a first portion thereof. The first portion may be formed from a portion of the bottom surface of the first connection pattern toward a top surface of the first connection pattern.

The first shielding pattern and the second shielding pattern may be electrically separated from each other.

The first shielding pattern and the second shielding pattern may be electrically connected to each other.

The metal-diffusion barrier layer may be formed from at least one of silicon mononitride (SiN), silicon carbonitride (SiCN), silicon oxycarbonitride (SiOCN), silicon oxynitride (SiON), or silicon carbide (SiC).

According to an exemplary embodiment of the present inventive concept, an image sensor is provided. The image sensor includes a pixel array chip, a logic chip, and an interposed layer. The interposed layer is disposed on the pixel array chip. The logic chip is disposed on the interposed layer. The interposed layer electrically connects the pixel array chip to the logic chip. The interposed layer includes a first insulating layer, a second insulating layer, a first shielding pattern, a metal-diffusion barrier layer, and an interlayered connection pattern. The first insulating layer includes a first connection pattern electrically connected to a first interconnection wire of the pixel array chip. The second insulating layer is provided on the first insulating layer. The second insulating layer includes a second connection pattern electrically connected to the first connection pattern and a second interconnection wire of the logic chip. The first shielding pattern is provided in the first insulating layer and spaced apart from the first connection pattern. The second shielding pattern is provided in the second insulating layer and spaced apart from the second connection pattern. The metal-diffusion barrier layer is disposed between the first and second insulating layers. The interlayered connection pattern is disposed in the metal-diffusion barrier layer. The interlayered connection pattern electrically connects the first connection pattern to the second connection pattern.

According to an exemplary embodiment of the present inventive concept, an image sensor is provided. The image sensor includes a pixel array chip, a logic chip, and interposed layer. The interposed layer is disposed on the pixel array chip. The logic chip is disposed on the interposed layer. The interposed layer includes a connecting part and a shielding part. The connecting part electrically connects a first interconnection wire of the pixel array chip and a second interconnection wire of the logic chip to each other. The connecting part includes a first connection pattern electrically connected to the first connection wire and a second connection pattern electrically connected to the second connection wire. The shielding part is disposed spatially apart from the connecting part. The shielding part is electrically grounded to suppress an electrical coupling between the pixel array chip and the logic chip. The second connection pattern is disposed on a first surface of the first connection pattern. The first connection pattern is formed of a conductive material except a first portion. The first portion is formed from a portion of the first surface toward the inside of the first connection pattern.

The first connection pattern has a plate shape in a plan view, and the second connection pattern includes a plurality of pieces spaced apart from each other.

The connecting part may further include an interlayered connection pattern provided between the first and second connection patterns to electrically connect the first and second connection patterns to each other.

The image sensor may further include a metal-diffusion barrier layer disposed on top and bottom surfaces of the interposed layer to limit diffusion of electrical charges to the pixel array chip and the logic chip.

The first portion of the first connection pattern may include an insulating material.

The shielding part may include a first shielding pattern provided in the first insulating layer and spaced apart from the first connection pattern.

BRIEF DESCRIPTION OF THE DRAWINGS

Exemplary embodiments of the present inventive concept will be more clearly understood from the following description taken in conjunction with the accompanying drawings, in which.

DETAILED DESCRIPTION OF THE EMBODIMENTS

Figure 1:
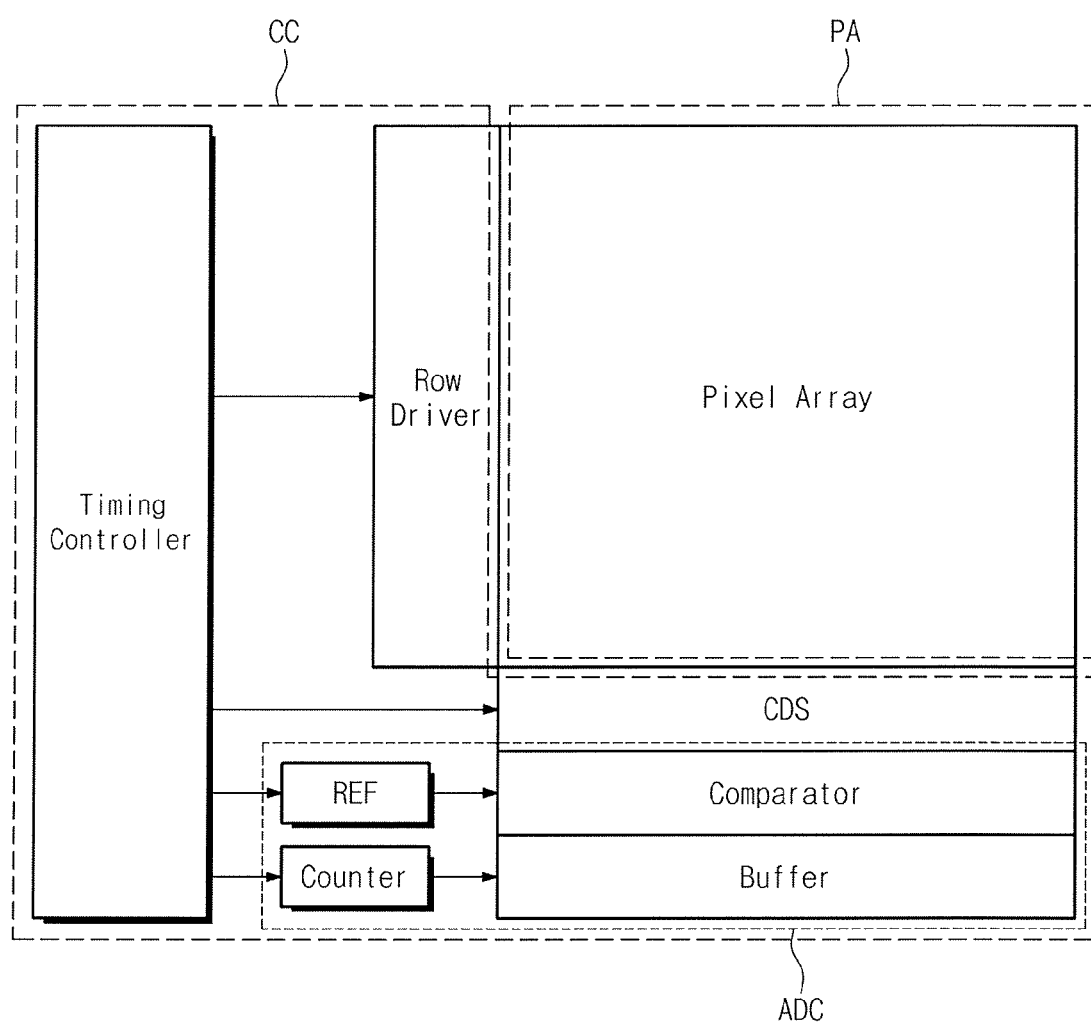
FIG. 1 is a block diagram illustrating an image sensor according to an exemplary embodiment of the present inventive concept.

Exemplary embodiments of the present inventive concept will now be described more fully with reference to the accompanying drawings, in which exemplary embodiments are shown. Exemplary embodiments of the present inventive concepts may, however, be embodied in many different forms and should not be construed as being limited to the embodiments set forth herein. In the drawings, the sizes and the thicknesses of layers and regions may be exaggerated for clarity. Like reference numerals may refer like elements throughout the specification and drawings, and thus duplicate description will be omitted.

It will be understood that when an element or layer is referred to as being "connected" or "coupled" to another element, it can be directly connected or coupled to the other element or intervening elements may be present. As used herein, the term "and/or" includes any and all combinations of one or more of the associated listed items.

As used herein, the singular forms "a," "an" and "the" are intended to include the plural forms as well, unless the context clearly indicates otherwise.

A device or a method of forming the device according to an exemplary embodiment of the present inventive concept described herein may be embodied in a microelectronic device such as an integrated circuit. A plurality of devices according to exemplary embodiments described herein of the present inventive concept is integrated in the same microelectronic device. Accordingly, the cross-sectional view(s) of the microelectronic device illustrated herein may be replicated in two different directions crossing each other (e.g., orthogonal to each other). Thus, a plan view of the microelectronic device that embodies the device according to an exemplary embodiment of the present inventive concept may include a plurality of the devices arranged in an array and/or in a two-dimensional pattern based on the functionality of the microelectronic device.

The device according to an embodiment of the present inventive concept described herein may be interspersed among other devices depending on the functionality of the microelectronic device. In addition, a microelectronic device according to an exemplary embodiment of the present inventive concept described herein may be replicated in a third direction that may be orthogonal to the two different directions to provide a three-dimensional integrated circuit.

Accordingly, the cross-sectional view(s) illustrated herein provide support for a plurality of devices according to exemplary embodiments of the present inventive concept that extend along two different directions in a plan view and/or in three different directions in a perspective view. For example, when a single active region is illustrated in a cross-sectional view of a device/structure, the device/structure may include a plurality of active regions and transistor structures (e.g., memory cell structures, gate structures, etc., as appropriate to the case) thereon, as would be illustrated by a plan view of the device/structure.

All the elements throughout the specification and drawings may be circuits.

FIG. 1 is a block diagram illustrating an image sensor according to an exemplary embodiment of the present inventive concept. The image sensor may include a complementary metal-oxide semiconductor (CMOS)-type image sensor. In an exemplary embodiment described with reference to FIG. 1, the image sensor may be the complementary metal-oxide semiconductor (CMOS)-type image sensor.

Referring to FIG. 1, the image sensor may include a pixel array PA and a signal processing unit CC.

The pixel array PA may be configured to convert incident light to electrical signals. The pixel array PA may include a plurality of unit pixels arranged in a matrix shape. The pixel array PA may be driven by various driving signals transmitted from the signal processing unit CC and may provide the converted electrical signals to the signal processing unit CC.

The signal processing unit CC may be configured to produce image data based on the electrical signals transmitted from the pixel array PA. The signal processing unit CC may include a row driver, a correlated double sampler (CDS), an analog-to-digital converter (ADC), and a timing controller.

The row driver may be connected to each of a plurality of rows of the pixel array PA and may generate row driving signals for driving the plurality of rows of the pixel array PA. For example, the row driver may drive the plurality of unit pixels in the pixel array PA by a unit of row.

The CDS may be configured to perform a correlated doubling sampling using a capacitor and a switch, and to output analog sampling signals. The correlated doubling sampling may include calculating a difference between a reference voltage corresponding to a reset state of the unit pixels and an output voltage corresponding to incident light (e.g., intensity of incident light). The analog sampling signal may be generated to correspond to an effective signal component. For example, the effective signal component may be a signal component corresponding to intensity of the incident light such that a difference between the reference voltage and a voltage level of the signal component is greater than a predetermined value. The CDS may include a plurality of CDS circuits, each of which is connected to each of column lines of the pixel array PA and may be configured to output a corresponding analog sampling signal to each column line.

The ADC may convert the analog sampling signal to a digital image signal. The ADC may include a reference signal generator (REF), a comparator, a counter, and a buffer. The REF may generate a ramp signal with a constant slope. The ramp signal may be provided to the comparator as a reference signal. The comparator may compare the analog sampling signal, which is output from the CDS through each column line, with the ramp signal generated by the REF, and may generate a comparative signal based on a comparison result. A transition point of the comparative signal is determined by the effective signal component. For example, the transition point may be a point when the comparative signal changes between its positive and negative values. The counter may perform a counting operation to generate a counting signal and may provide the counting signal to the buffer. The buffer may include a plurality of latch circuits, each of which is connected to each of the column lines, and latch the counting signal output from the counter to each column line in response to transition of each comparative signal. Further, the buffer may output the latched counting signal to the outside as the image data.

The timing controller may control operation timings of the row driver, the CDS, and the ADC. The timing controller may provide a timing signal and a control signal to the row driver, the CDS, and the ADC.

The analog double sampling (ADS) of the image sensor has been described with reference to FIG. 1, but exemplary embodiments of the present inventive concept are not limited thereto. In an exemplary embodiment, the image sensor may be configured to perform a digital double sampling (DDS). The DDS may convert an analog signal corresponding to the reset state when the pixel is initialized and an analog signal (e.g., a signal component) corresponding to intensity of incident light to digital signals. Further, the DDS may extract an effective signal component using a difference between these converted digital signals.

FIGS. 2A through 2D are circuit diagrams each illustrating a unit pixel included in a pixel array according to an exemplary embodiment of the present inventive concept.

Figure 2A:
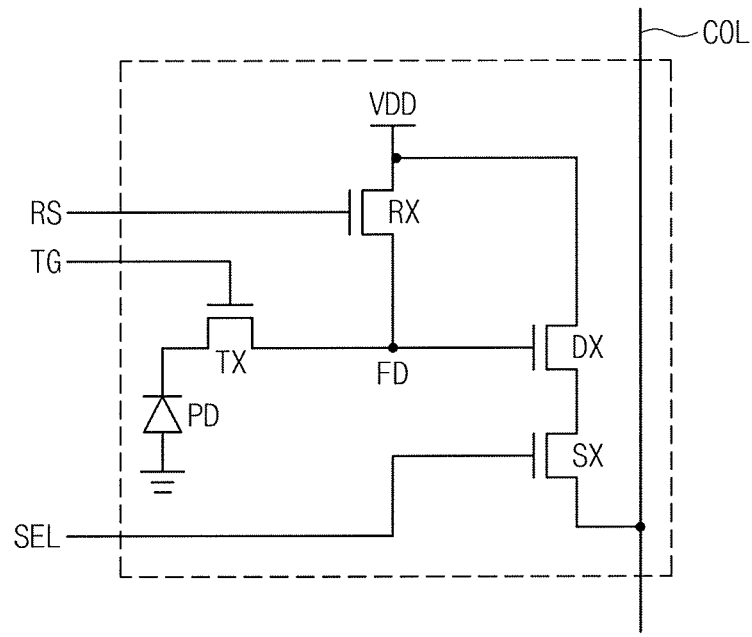
FIGS. 2A through 2D are circuit diagrams each illustrating a unit pixel included in a pixel array according to an exemplary embodiment of the present inventive concept.

Referring to FIG. 2A, the unit pixel may include a photodiode PD, which is used as a light detection device, and a readout circuit. The readout circuit may include a transfer transistor TX, a reset transistor RX, a drive transistor DX, and a selection transistor SX.

The photodiode PD may receive external light (e.g., visible or infrared light) and generate photocharges from the light. In an exemplary embodiment, the unit pixel may include at least one of a phototransistor, a photo gate, or a pinned photo diode. The phototransistor, the photo gate, or the pinned photo diode may be provided with the photodiode PD. In an exemplary embodiment, the phototransistor, the photo gate, or the pinned photo diode may be provided instead of the photodiode PD.

The photocharges generated by the photodiode PD may be transferred to a floating diffusion node FD through the transfer transistor TX. For example, when a transfer control signal TG has a first level (e.g., a high level), the transfer transistor TX may be turned on, and the photocharges generated in the photodiode PD may be transferred to the floating diffusion node FD through the transfer transistor TX.

The drive transistor DX may serve as a source follower buffer amplifier and may amplify a signal corresponding to an amount of the photocharge stored in the floating diffusion node FD. The selection transistor SX may transfer the amplified signal to a column line COL in response to a selection signal SEL. The floating diffusion node FD may be reset by the reset transistor RX. For example, the reset transistor RX may discharge the photocharges stored in the floating diffusion node FD after every period of the CDS operation, in response to a reset signal RS. For example, each of the transistors TX, RX, DX, and SX may be a metal-oxide-semiconductor field-effect transistor (MOSFET)

Although FIG. 2A illustrates that the unit pixel includes a single photodiode PD and four transistors (e.g., MOSFETs) TX, RX, DX, and SX, exemplary embodiments of the present inventive concepts are not limited thereto. For example, the unit pixel may have other structures as shown in FIGS. 2B through 2D.

Figure 2B:
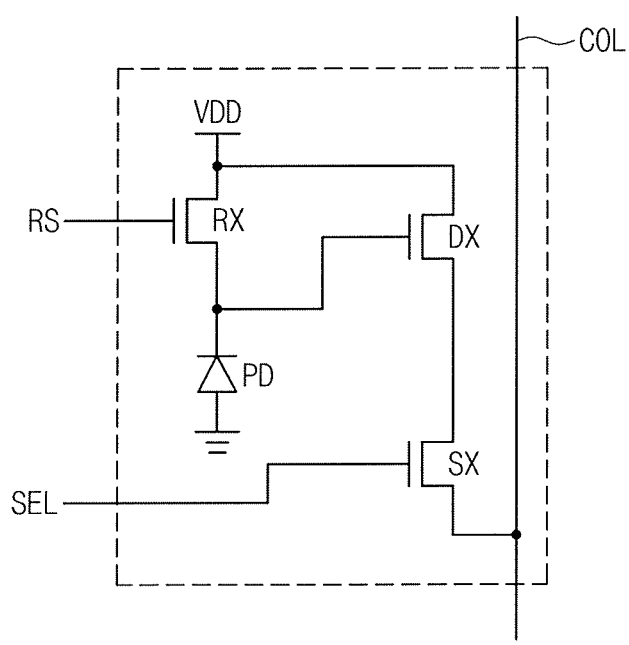

Referring to FIG. 2B, the unit pixel may include the photodiode PD, which is used as the light detection device, and a readout circuit. The readout circuit may include the reset transistor RX, the drive transistor DX, and the selection transistor SX. For example, the unit pixel of FIG. 2B may be configured to have three transistors (e.g., MOSFETs).

Figure 2C:
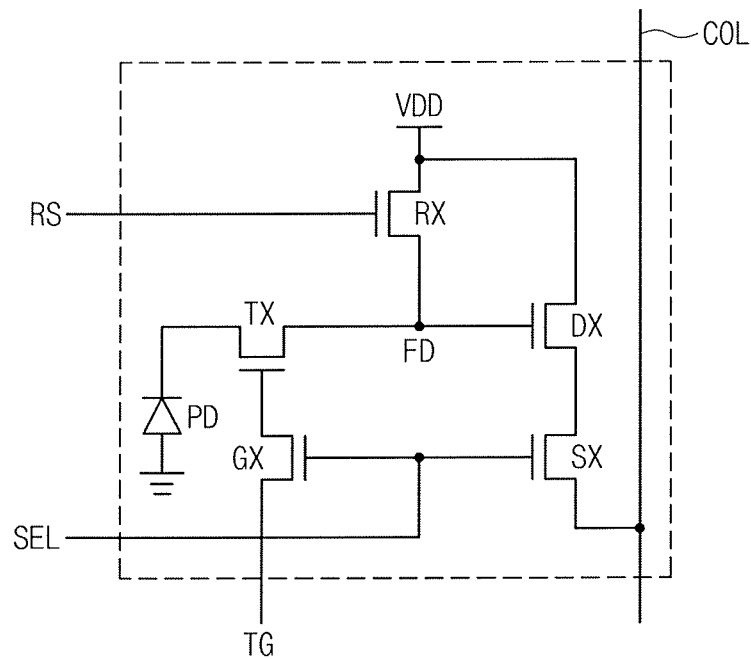

Referring to FIG. 2C, the unit pixel may include the photodiode PD, which is used as the light detection device, and a readout circuit. The readout circuit may include the transfer transistor TX, a gate transistor GX, the reset transistor RX, the drive transistor DX, and the selection transistor SX. For example, the unit pixel of FIG. 2C may be configured to have five transistors. The gate transistor GX may be configured to selectively apply the transfer control signal TG to the transfer transistor TX in response to the selection signal SEL.

Figure 2D:
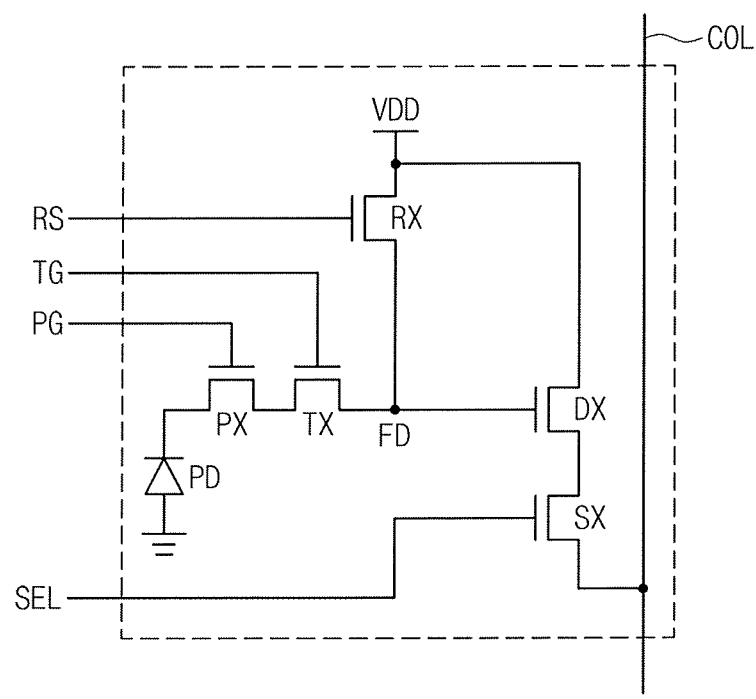

Referring to FIG. 2D, the unit pixel may include the photodiode PD, which is used as the light detection device, and a readout circuit. The readout circuit may include a phototransistor PX (e.g., a photo gate), the transfer transistor TX, the reset transistor RX, the drive transistor DX, and the selection transistor SX. For example, the unit pixel of FIG. 2D may be configured to have five transistors (e.g., MOS- FETs). In an exemplary embodiment, the unit pixel may be configured to have six transistors (e.g., MOSFETs) by further including the gate transistor GX or a bias transistor. The phototransistor PX may be turned on or turned off in response to a photo gate signal PG. When the phototransistor PX is turned on, the photodiode PD may generate photocharges by sensing light incident to the photodiode PD. When the phototransistor PX is turned off, the photodiode PD might not perform the light-sensing operation.

In addition, the unit pixel may have one of the structures illustrated in FIGS. 2A through 2D, and each of the unit pixels illustrated in FIGS. 2A through 2D may operate in an independent manner. In an exemplary embodiment, at least one component of a unit pixel may be shared by another unit pixel. For example, to implement a plurality of pixels each having the unit pixel structure of FIG. 2A, each of the plurality of pixels (e.g., two or four pixels) may be configured to have a photodiode PD and a transfer transistor TX which are not shared by another pixel of the plurality of pixels, and components other than the photodiode PD and the transfer transistor TX may be shared by another pixel of the plurality of pixels. In this case, each of the pixels may be independently operated by a timing control.

Figure 3:
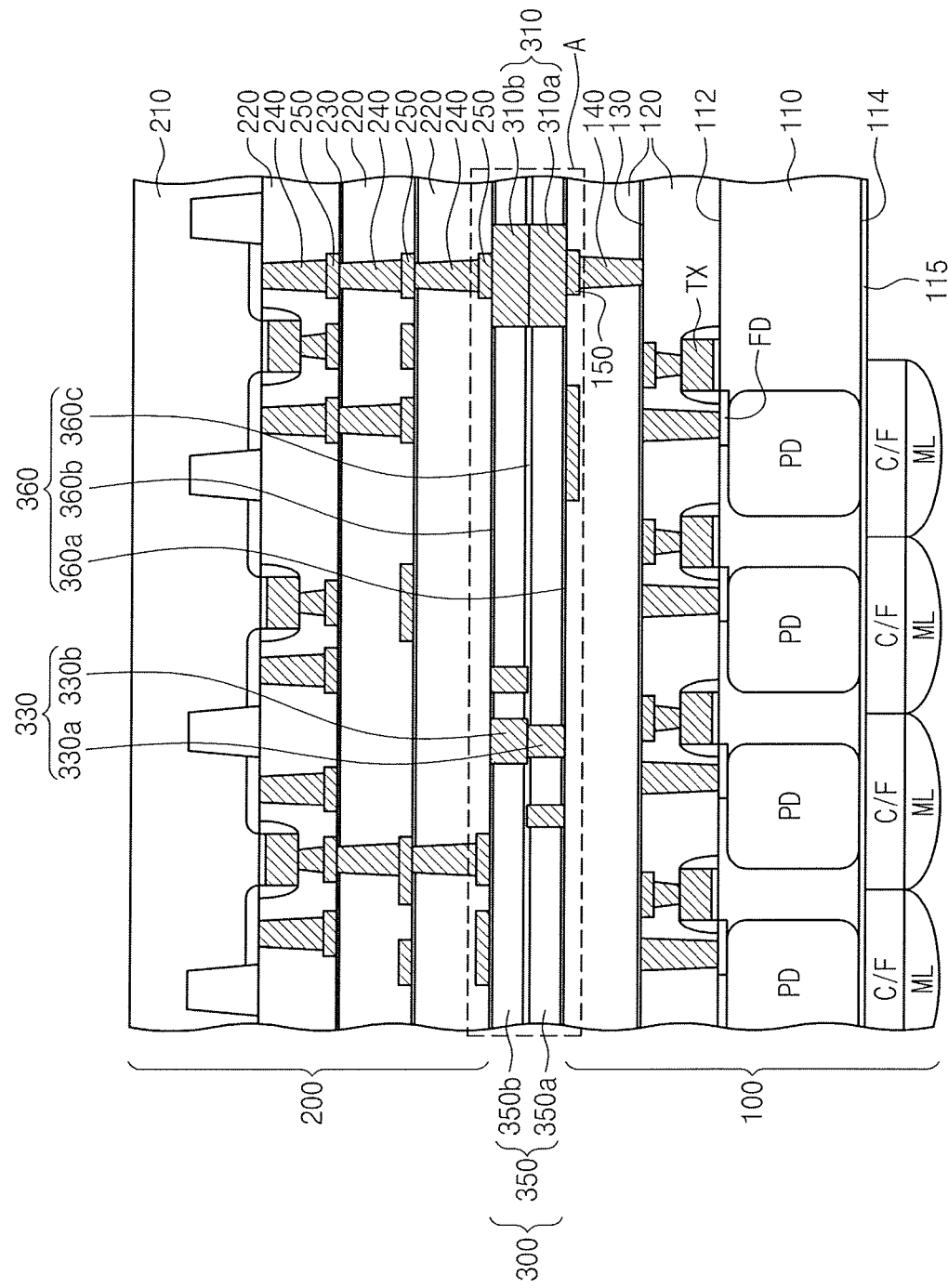
FIG. 3 is a sectional view illustrating an image sensor according to an exemplary embodiment of the present inventive concept.

FIG. 3 is a sectional view illustrating an image sensor according to an exemplary embodiment of the present inventive concept.

Referring to FIG. 3, the image sensor may include a pixel array chip 100, a logic chip 200, and an interposed layer 300 between the pixel array chip 100 and the logic chip 200. Referring to FIGS. 1 and 3, the pixel array chip 100 may include the pixel array PA of FIG. 1. The logic chip 200 may include the signal processing unit CC of FIG. 1.

In an exemplary embodiment, the pixel array chip 100 and the logic chip 200 may be vertically stacked one on another, and the interposed layer 300 may electrically connect the pixel array chip 100 to the logic chip 200.

The pixel array chip 100 may include a first substrate 110, a photoelectric conversion device PD', the floating diffusion region FD, and a readout circuit device. The readout circuit device may include the transfer gate TX. The readout circuit device may further include a reset gate, a drive gate, and/or a selection gate.

The first substrate 110 may have a top surface 112 and a bottom surface 114. In an exemplary embodiment, the image sensor may be a backside illuminated image sensor (BIS). The backside illuminated image sensor (BIS) may be configured to produce image data from light which is incident thereto through the bottom surface 114 of the first substrate 110. In an exemplary embodiment, the first substrate 110 may include a semiconductor layer grown by an epitaxial process, and the first substrate 110 may be doped to have a p-type conductivity.

In an exemplary embodiment, in the BIS-type image sensor, a plurality of gate structures may be formed on the top surface 112 of the first substrate 110 to perform operations for transferring and amplifying electrical signals (e.g., photocharges) generated from the incident light. Further, a color filter CF and a micro lens ML may be formed on the bottom surface 114 of the first substrate 110 to guide the incident light into the photoelectric conversion device PD'.

The photoelectric conversion device PD' may be formed in the first substrate 110 to generate photocharges corresponding to the incident light. For example, electron-hole pairs corresponding to the incident light may be generated in the photoelectric conversion device PD', and electrons or holes generated through this process may be stored in the photoelectric conversion device PD'. The photoelectric conversion device PD' may be doped to have a conductivity type (e.g., n-type) different from that of the first substrate 110.

In an exemplary embodiment, the photoelectric conversion device PD' may include a photodiode, a phototransistor, a photo gate, a pinned photo diode, or any combination thereof.

To transfer the photocharges from the photoelectric conversion device PD' to the floating diffusion region FD, the transfer gate TX may be formed on the top surface of the first substrate 110. The transfer gate TX may receive a transfer signal. When the transfer signal is activated (for example, when the transfer signal has a first level), the photocharges generated by the photoelectric conversion device PD' may be transferred to the floating diffusion region FD.

The photocharges, which are transferred to and stored in the floating diffusion region FD, may be used to produce image data of the image sensor. For example, the image data may be produced based on an amount of the photocharges transferred to the floating diffusion region FD.

The reset gate may be formed on the top surface of the first substrate 110 and may receive a reset signal. A reset drain region may be formed in the first substrate 110, and a voltage for resetting the floating diffusion region FD may be applied to the reset drain region. For example, when the reset signal is activated (e.g., when the reset signal has a first level), the photocharges stored in the floating diffusion region FD may be discharged (or reset) using the voltage applied to the reset drain region.

A device isolation part may be additionally formed to enclose a unit pixel and to separate the unit pixel from other unit pixels adjacent thereto.

The color filter CF may be provided on the bottom surface 114 of the first substrate 110 to face the photoelectric conversion device PD'. The color filters CF may be arranged in a matrix form to constitute a color filter array. In an exemplary embodiment, the color filter array may have a Bayer pattern including a red filter, a green filter, and a blue filter. In this case, each of the color filters CF in the color filter array may be one of the red filter, the green filter, and the blue filter. In an exemplary embodiment, the color filter array may include a yellow filter, a magenta filter, and a cyan filter. In this case, each of the color filters CF may be one of the yellow filter, the magenta filter, and the cyan filter. In addition, the color filter array may further include a white filter.

The micro lens ML may be provided on the color filter CF to face the photoelectric conversion device PD' through the color filter CF. The micro lens ML may control a propagation path of incident light such that the incident light can be properly guided into the photoelectric conversion device PD'. Further, the micro lens ML may be arranged in a matrix form to constitute a micro lens array.

An anti-reflection layer 115 may be provided between the bottom surface 114 of the first substrate 110 and the color filter CF. The anti-reflection layer 115 may prevent the incident light from being reflected by the bottom surface 114 of the first substrate 110. In an exemplary embodiment, the anti-reflection layer 115 may be formed by alternately stacking at least two layers having different refractive indices from each other, and in this case, the more the layers are alternately stacked, the greater the transmittance of the anti-reflection layer 115.

A first interlayered insulating layer 120 may be formed on the first substrate 110 to cover the plurality of gate structures. The first interlayered insulating layer 120 may have a multi-layered structure. The first interlayered insulating layer 120 may include an oxide layer which is formed of, e.g., silicon oxide.

A plurality of first wires 150 may be provided in the first interlayered insulating layer 120 and may be electrically connected to the gate structures. The first wires 150 may include a metallic material (e.g., copper or tungsten). Further, the first wires 150 may be electrically connected to the gate structures through a first contact plug 140.

In an exemplary embodiment, a first metal-diffusion barrier layer 130 may be further provided in the first interlayered insulating layer 120. The first metal-diffusion barrier layer 130 may be formed of a material including at least one of silicon mononitride (SiN), silicon carbonitride (SiCN), silicon oxycarbonitride (SiOCN), silicon oxynitride (SiON), silicon carbide (SiC), or the like. The first metal-diffusion barrier layer 130 may prevent metallic elements in the first wires 150 from being diffused to a neighboring component.

The logic chip 200 may include a second substrate 210, a second interlayered insulating layer 220 covering the second substrate 210, and a plurality of second wires 250 provided in the second interlayered insulating layer 220.

The second substrate 210 may be a semiconductor wafer, a silicon-on-insulator (SOI) wafer, a germanium-on-insulator (GOI) wafer, or the like. The semiconductor wafer may be formed of, e.g., silicon, germanium, or a combination of the silicon and the germanium A plurality of logic gate structures may be formed on the second substrate 210. The second interlayered insulating layer 220 may be provided to cover the logic gate structures. The second interlayered insulating layer 220 may include an oxide layer which is formed of, e.g., silicon oxide.

The second wires 250 may include a metallic material (e.g., copper or tungsten). The second wires 250 may be electrically connected to the logic gate structures via a second contact plug 240. Devices serving as the signal processing unit of FIG. 1 may be further formed on the second substrate 210 or in the second interlayered insulating layer 220.

In an exemplary embodiment, a second metal-diffusion barrier layer 230 may be further provided in the second interlayered insulating layer 220. The second metal-diffusion barrier layer 230 may be formed of a material including at least one of SiN, SiCN, SiOCN, SiON, SiC, or the like. The second metal-diffusion barrier layer 230 may prevent metallic elements in the second wires 250 from being diffused to a neighboring component.

The interposed layer 300 may include a connecting part 310 and a shielding part 330. The connecting part 310 may electrically connect the pixel array chip 100 with the logic chip 200. The shielding part 330 may suppress an electrical coupling between the pixel array chip 100 and the logic chip 200. The connecting part 310 and the shielding part 330 may include a metallic material (e.g., copper or tungsten). Further, the shielding part 330 may be grounded.

In an exemplary embodiment, the connecting part 310 may include a first connection pattern 310a connected to at least one of the first wires 150 and a second connection pattern 310b connected to at least one of the second wires 250. The first connection pattern 310a and the second connection pattern 310b may be electrically connected to each other.

The shielding part 330 may include a first shielding pattern 330a and a second shielding pattern 330b. The first shielding pattern 330a may be provided on substantially the same plane as the first connection pattern 310a and may be grounded. The second shielding pattern 330b may be provided on substantially the same plane as the second connection pattern 310b and may be grounded.

The interposed layer 300 may include an insulating layer 350. Each of the connecting part 310 and the shielding part 330 may be provided to penetrate the insulating layer 350.

In an exemplary embodiment, the insulating layer 350 may include a first insulating layer 350a and a second insulating layer 350b. The first connection pattern 310a and the first shielding pattern 330a may be disposed in the first insulating layer 350a, and the second connection pattern 310b and the second shielding pattern 330b may be disposed in the second insulating layer 350b.

A metal-diffusion barrier layer 360 may be interposed between the first and second insulating layers 350a and 350b. In an exemplary embodiment, the metal-diffusion barrier layer 360 may include a first metal-diffusion barrier layer 360a provided below the first insulating layer 350a, a second metal-diffusion barrier layer 360b provided on the second insulating layer 350b, and a third metal-diffusion barrier layer 360c provided between the first and second insulating layers 350a and 350b. The first and second insulating layers 350a and 350b may include an oxide layer formed of, e.g., silicon oxide, and the metal-diffusion barrier layer 360 may be formed of a material including at least one of SiN, SiCN, SiOCN, SiON, SiC, or the like. The metal-diffusion barrier layer 360 may prevent metallic elements (e.g., copper or tungsten) in the connecting part 310 and the shielding part 330 from being diffused into a neighboring component.

Each of the connecting part 310 and the shielding part 330 may have various structures. Hereinafter, the structures of each of the connecting part 310 and the shielding part 330 will be described in more detail.

FIGS. 4A through 4D are sectional views illustrating structures of an interposed layer according to an exemplary embodiment of the present inventive concept. Here, FIGS. 4A through 4D may be enlarged views of a portion A of FIG. 3 according to an exemplary embodiment of the present inventive concept. FIGS. 5A and 5B are plan views illustrating a connecting part of FIG. 4D according to an exemplary embodiment of the present inventive concept. FIGS. 5A and 5B may be plan views for a portion B of FIG. 4D according to an exemplary embodiment of the present inventive concept.

Figure 4A:
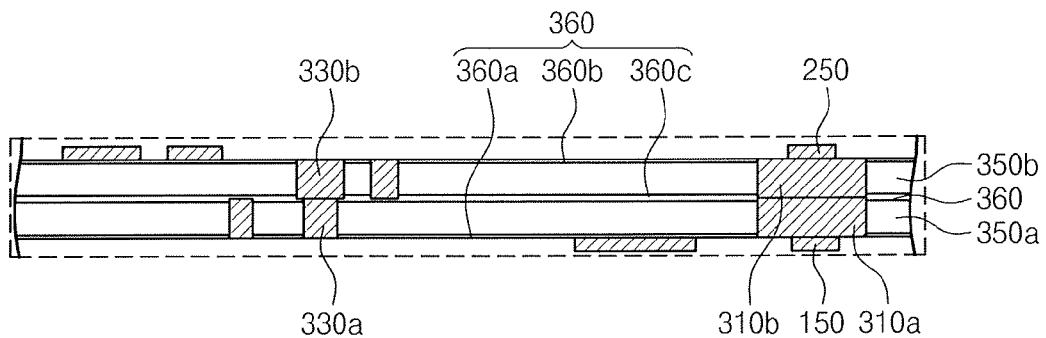
FIGS. 4A through 4D are sectional views illustrating structures of an interposed layer according to an exemplary embodiment of the present inventive concept.
Figure 4B:
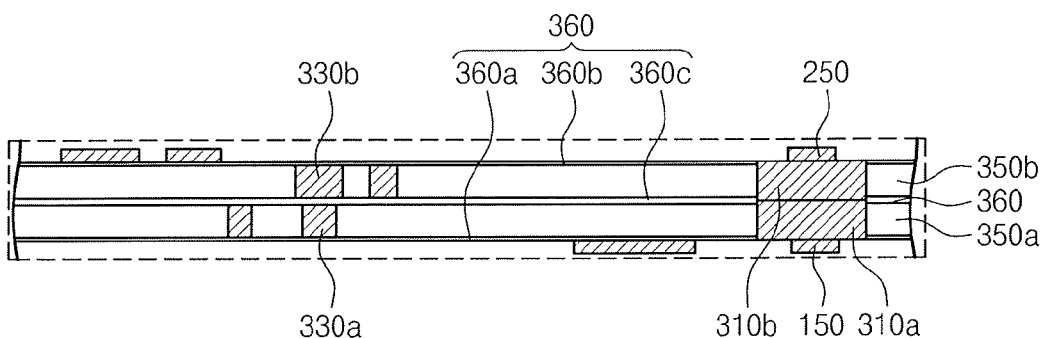
Figure 5A:
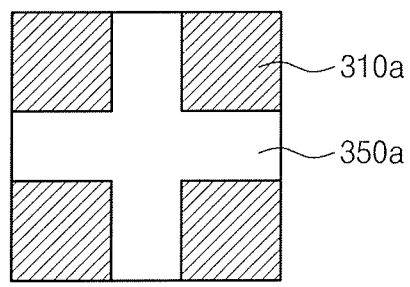
FIGS. 5A and 5B are plan views illustrating a connecting part of FIG. 4D according to an exemplary embodiment of the present inventive concept.
Figure 5B:
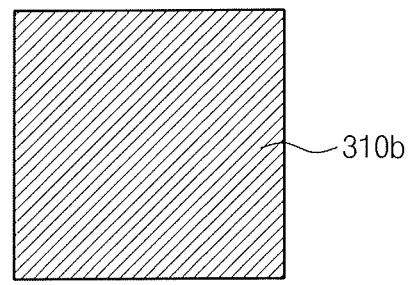

Referring to FIGS. 4A and 4B, the first connection pattern 310a and the second connection pattern 310b may have substantially the same structure as each other. The first connection pattern 310a may be provided such that a surface of the first connection pattern 310a is in full contact with a surface of the second connection pattern 310b.

In an exemplary embodiment as shown in FIG. 4A, the first shielding pattern 330a and the second shielding pattern 330b may be electrically connected to each other. For example, the first and second shielding patterns 330a and 330b may penetrate the third metal-diffusion barrier layer 360c to be in electrically contact with each other.

In an exemplary embodiment as shown in FIG. 4B, the first shielding pattern 330a and the second shielding pattern 330b may be electrically separated from each other by the third metal-diffusion barrier layer 360c.

Figure 4C:
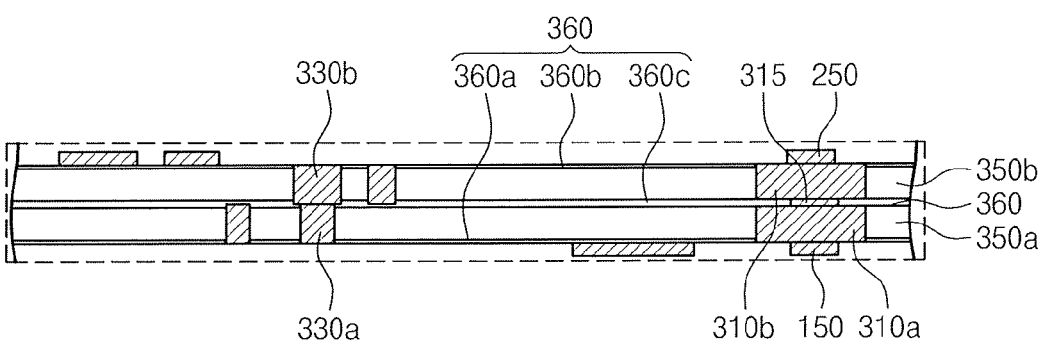

Referring to FIG. 4C, an interlayered connection pattern 315 may further be provided between the first connection pattern 310a and the second connection pattern 310b. The interlayered connection pattern 315 may include a material substantially the same as that of the first and second connection patterns 310a and 310b. The interlayered connection pattern 315 may have an area or size smaller than that of the first and second connection patterns 310a and 310b. However, a size and a structure of the interlayered connection pattern 315 are not limited thereto. In an exemplary embodiment, the interlayered connection pattern 315 may be provided to penetrate the third metal-diffusion barrier layer 360c. In an exemplary embodiment, the interlayered connection pattern 315 may be disposed in the third metal-diffusion barrier layer 360c to electrically connect the first connection pattern 310a to the second connection pattern 310b.

Figure 4D:
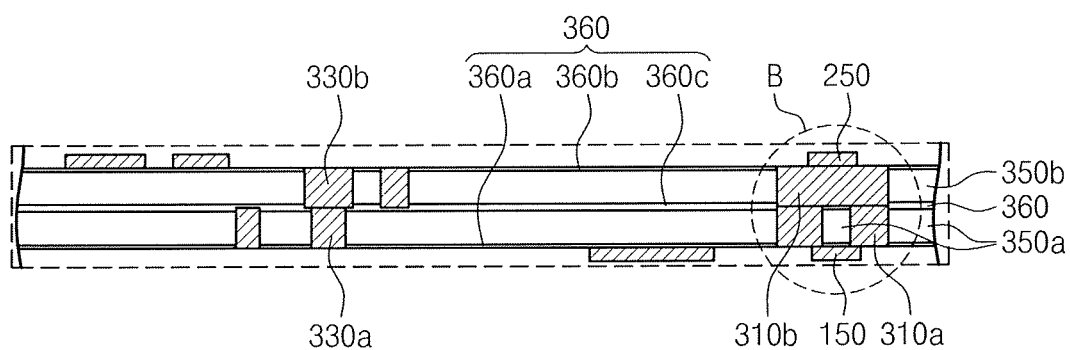

Referring to FIGS. 4D, 5A, and 5B, the first connection pattern 310a and the second connection pattern 310b may have different structures from each other.

When a size of each of the first and second connection patterns 310a and 310b increases, misalignment between the first and second connection patterns 310a and 310b may be reduced. Since the first and second connection patterns 310a and 310b includes a metallic material (e.g., copper or tungsten), increasing the size of each of the first and second connection patterns 310a and 310b may increase metal erosion. Thus, in an exemplary embodiment as shown in FIGS. 5A and 5B, the second connection pattern 310b may have a plate shape in, e.g., a plan view, and the first connection pattern 310a may include a plurality of pieces spaced apart from each other. Each of the plurality of pieces has a plate shape. For example, the pieces of the first connection pattern 310a may be separated from each other in spatial and electrical manners by the first insulating layer 350a.

Figure 6:
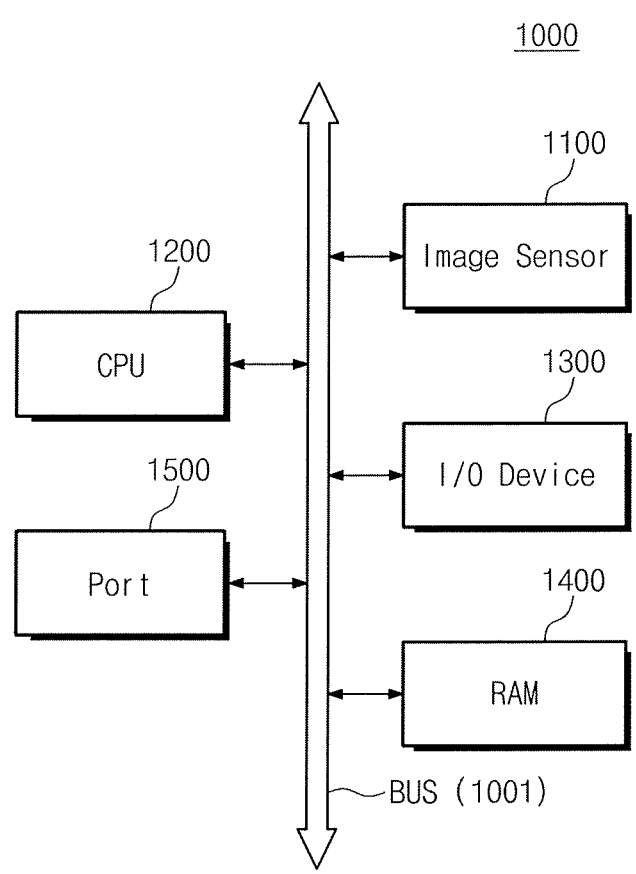
FIG. 6 is a block diagram illustrating a processor-based system including an image sensor according to an exemplary embodiment of the present inventive concept.

FIG. 6 is a block diagram illustrating a processor-based system 1000 including an image sensor according to an exemplary embodiment of the present inventive concept.

Referring to FIG. 6, the processor-based system 1000 processes output images of an image sensor 1100.

The processor-based system 1000 may include a computer system, a camera system, a scanner, a mechanical clock system, a navigation system, a video phone, a monitoring system, an automatic focus system, a tracking system, an operation monitoring system, an image stabilizing system, or the like. However, exemplary embodiments of the present inventive concept are not limited thereto.

The processor-based system 1000 such as a computer system may include a central processing unit (CPU) 1200 (e.g., a microprocessor) which can communicate with an I/O device 1300 via a bus 1001. The image sensor 1100 may communicate with the CPU 1200 and/or the I/O device 1300 via the bus 1001 or any other communication link. The processor-based system 1000 may further include a random access memory (RAM) 1400 and/or a port 1500 which can communicate with the CPU 1200 through the bus 1001.

The port 1500 may be electrically coupled with a video card, a sound card, a memory card, a universal serial bus (USB) device, or the like. Further, the port 1500 may be connected to an additional system to carry out data communication with the additional system. The image sensor 1100 may be integrated with a CPU, a digital signal processing device (DSP), a microprocessor, or the like. Further, the image sensor 1100 may be integrated with a memory. In an exemplary embodiment, the image sensor 1100 may be integrated in a chip which is separate from a processor.

Figure 7:
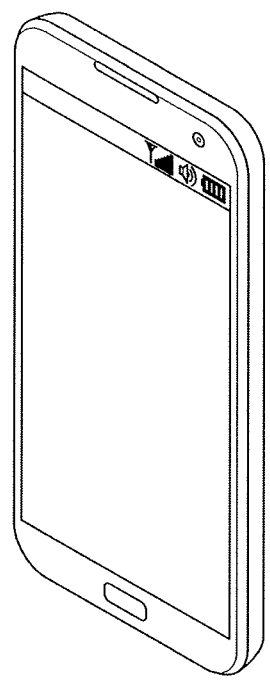
FIG. 7 is a perspective view illustrating an electronic device including an image sensor according to an exemplary embodiment of the present inventive concept.

FIG. 7 is a perspective view illustrating an electronic device including an image sensor according to an exemplary embodiment of the present inventive concept.

Referring to FIG. 7, the image sensor according to an exemplary embodiment of the present inventive concept may be applicable to a mobile phone 2000. Further, the image sensor according to an exemplary embodiment of the present inventive concept may be applicable to a camera, a camcorder, a personal digital assistant (PDA), a wireless phone, a laptop computer, an optical mouse, a facsimile machine, a copy machine, or the like. In addition, the image sensor according to an exemplary embodiment of the present inventive concept may be disposed in a telescope, a mobile phone handset, a scanner, an endoscope, a fingerprint recognition system, a toy, a game machine, a household robot, an automobile, or the like.

According to an exemplary embodiment of the present inventive concept, a pixel array chip and a logic chip of the image sensor are vertically stacked one on another, and an interposed layer is disposed between the pixel array chip and the logic chip to electrically connect the pixel array chip to the logic chip, and thus, an electrical coupling between the pixel array chip and the logic chip may be prevented.

While exemplary embodiments of the present inventive concept have been particularly shown and described, it will be understood that various change in form and detail may be made therein without departing from the spirit and scope of the present inventive concept as defined by the following claims.

What is claimed is:

1. An image sensor, comprising:
   a pixel array chip;
   an interposed layer disposed on the pixel array chip; and
   a logic chip disposed on the interposed layer,
   wherein the interposed layer comprises:
   first and second insulating layers stacked on top of one another;
   a connecting part electrically connecting a first interconnection wire of the pixel array chip and a second interconnection wire of the logic chip;
   a shielding part disposed spatially apart from the connecting part in the interposed layer; and
   a first metal-diffusion barrier layer provided between the first and second insulating layers,
   wherein the connecting part comprises:
   a first connection pattern disposed in the first insulating layer; and
   second connection patterns disposed in the second insulating layer,
   wherein the second connection patterns are directly connected to the first connection pattern in the first metal-diffusion barrier layer, and
   wherein a portion of the second insulating layer extends through the connecting part.

2. The image sensor of claim 1, wherein the pixel array chip comprises at least one photoelectric conversion device.

3. The image sensor of claim 1, wherein each of the connecting part and the shielding part is formed of copper (Cu) or tungsten (W).

4. The image sensor of claim 1, wherein each of the connecting part and the shielding part is provided to penetrate the first and second insulating layers.

5. The image sensor of claim 1, wherein at least one second metal-diffusion barrier layer is provided on top and bottom surfaces of the interposed layer.

6. The image sensor of claim 1,
   wherein the shielding part comprises a first shielding pattern and a second shielding pattern,
   wherein the first shielding pattern is provided in the first insulating layer and spaced apart from the first connection pattern, and
   wherein the second shielding pattern is provided in the second insulating layer and spaced apart from the second connection patterns.

7. The image sensor of claim 6, wherein the first connection pattern and the second connection patterns are in contact with each other.

8. The image sensor of claim 6, wherein the first shielding pattern and the second shielding pattern are electrically connected to each other.

9. The image sensor of claim 1, wherein the second connection patterns are disposed on a first surface of the first connection pattern,
  wherein the first connection pattern is formed of a conductive material except a first portion, and
  wherein the first portion is formed from a portion of the first surface toward the inside of the first connection pattern.

10. The image sensor of claim 1, wherein the first metal-diffusion barrier layer is formed from at least one of silicon mononitride (SiN), silicon carbonitride (SiCN), silicon oxycarbonitride (SiOCN), silicon oxynitride (SiON), or silicon carbide (SiC).

* * * * *